United States Patent
Rosny et al.

(10) Patent No.: US 9,646,472 B2
(45) Date of Patent: May 9, 2017

(54) TAMPER EVIDENT SYSTEMS

(71) Applicant: Payment Express Limited, Ellerslie, Auckland (NZ)

(72) Inventors: Mark Rosny, Auckland (NZ); Mark Ross England, Auckland (NZ)

(73) Assignee: Payment Express Limited, Ellerslie (NZ)

( * ) Notice: Subject to any disclaimer, the term of this patent is extended or adjusted under 35 U.S.C. 154(b) by 139 days.

(21) Appl. No.: 14/421,295

(22) PCT Filed: Sep. 23, 2013

(86) PCT No.: PCT/NZ2013/000176
§ 371 (c)(1),
(2) Date: Feb. 12, 2015

(87) PCT Pub. No.: WO2014/027905
PCT Pub. Date: Feb. 20, 2014

(65) Prior Publication Data
US 2015/0199887 A1    Jul. 16, 2015

(51) Int. Cl.
*G08B 13/06* (2006.01)
*G01R 27/02* (2006.01)
*G08B 13/14* (2006.01)
*F16B 31/02* (2006.01)
*F16B 41/00* (2006.01)

(52) U.S. Cl.
CPC ............ *G08B 13/06* (2013.01); *F16B 31/028* (2013.01); *F16B 41/005* (2013.01); *G01R 27/02* (2013.01); *G08B 13/149* (2013.01)

(58) Field of Classification Search
CPC ..... G08B 13/149; G08B 13/06; F16B 31/028; F16B 41/005; G01R 27/02
See application file for complete search history.

(56) References Cited

U.S. PATENT DOCUMENTS

| 3,803,577 | A | 4/1974 | Peterson, II |
| 4,329,681 | A | 5/1982 | Parsons |
| 4,713,506 | A | 12/1987 | Klink |
| 5,488,206 | A | 1/1996 | Wu |
| 5,541,578 | A | 7/1996 | Lussey |

(Continued)

FOREIGN PATENT DOCUMENTS

| CN | 101319691 A | 12/2008 |
| DE | 3110581 A1 | 12/1982 |

(Continued)

*Primary Examiner* — Jay Patidar
*Assistant Examiner* — Haidong Zhang
(74) *Attorney, Agent, or Firm* — Larson & Anderson, LLC

(57) ABSTRACT

The invention disclosed is a tamper detection element to locate against a first member to detect tampering. The element has a resilient deformable member able to deform because of tamper induced deformation, a contact sensing member disposed towards the resilient deformable member, a first electrically conductive portion adjacent or on the resilient deformable member, and a second electrically conductive portion on the contact sensing member. An electrical relationship can then be formed between the first and second electrically conductive portions, and the tamper induced deformation results in a change of impedance of the electrical relationship, the change therefore indicative of the tampering.

23 Claims, 7 Drawing Sheets

(56) References Cited

U.S. PATENT DOCUMENTS

| | | | |
|---|---|---|---|
| 5,621,387 A | 4/1997 | Phillips et al. | |
| 5,705,981 A | 1/1998 | Goldman | |
| 6,054,922 A | 4/2000 | Smith | |
| 6,087,939 A | 7/2000 | Leyden et al. | |
| 6,265,973 B1 | 7/2001 | Brammall et al. | |
| 6,512,454 B2 | 1/2003 | Miglioli et al. | |
| 6,774,807 B1 | 8/2004 | Lehfeldt et al. | |
| 6,956,479 B2 | 10/2005 | Kelsch et al. | |
| 7,042,354 B2 | 5/2006 | Auerbach et al. | |
| 7,049,970 B2 | 5/2006 | Allen et al. | |
| 7,054,162 B2 | 5/2006 | Benson et al. | |
| 7,066,039 B1 | 6/2006 | Orlogi et al. | |
| 7,113,103 B2 | 9/2006 | Festa et al. | |
| 7,242,299 B2 | 7/2007 | Kelsch et al. | |
| 7,259,341 B2 | 8/2007 | Quinque et al. | |
| 7,317,401 B2 | 1/2008 | Germann et al. | |
| 7,639,133 B1 | 12/2009 | Kelsch et al. | |
| 7,671,276 B2 | 3/2010 | Baker | |
| 2002/0014962 A1* | 2/2002 | Miglioli | G08B 13/149 340/571 |
| 2002/0154023 A1 | 10/2002 | Hazan | |
| 2006/0048582 A1 | 3/2006 | Furukawa et al. | |
| 2007/0080802 A1 | 4/2007 | Cockburn et al. | |
| 2007/0290845 A1 | 12/2007 | Benjelloun et al. | |
| 2008/0291016 A1 | 11/2008 | Sharp | |
| 2009/0091144 A1 | 4/2009 | Debrody et al. | |
| 2010/0148796 A1 | 6/2010 | Feucht et al. | |
| 2010/0242629 A1 | 9/2010 | Leuenberger et al. | |
| 2011/0031985 A1* | 2/2011 | Johnson | G06F 21/86 324/681 |
| 2011/0063109 A1 | 3/2011 | Ostermoller | |
| 2011/0215938 A1 | 9/2011 | Neo et al. | |

FOREIGN PATENT DOCUMENTS

| | | |
|---|---|---|
| EP | 0540376 A1 | 5/1993 |
| EP | 2239651 A2 | 10/2010 |
| JP | 09159558 A | 6/1997 |
| WO | 0163994 A2 | 8/2001 |
| WO | 03005334 A2 | 1/2003 |

* cited by examiner

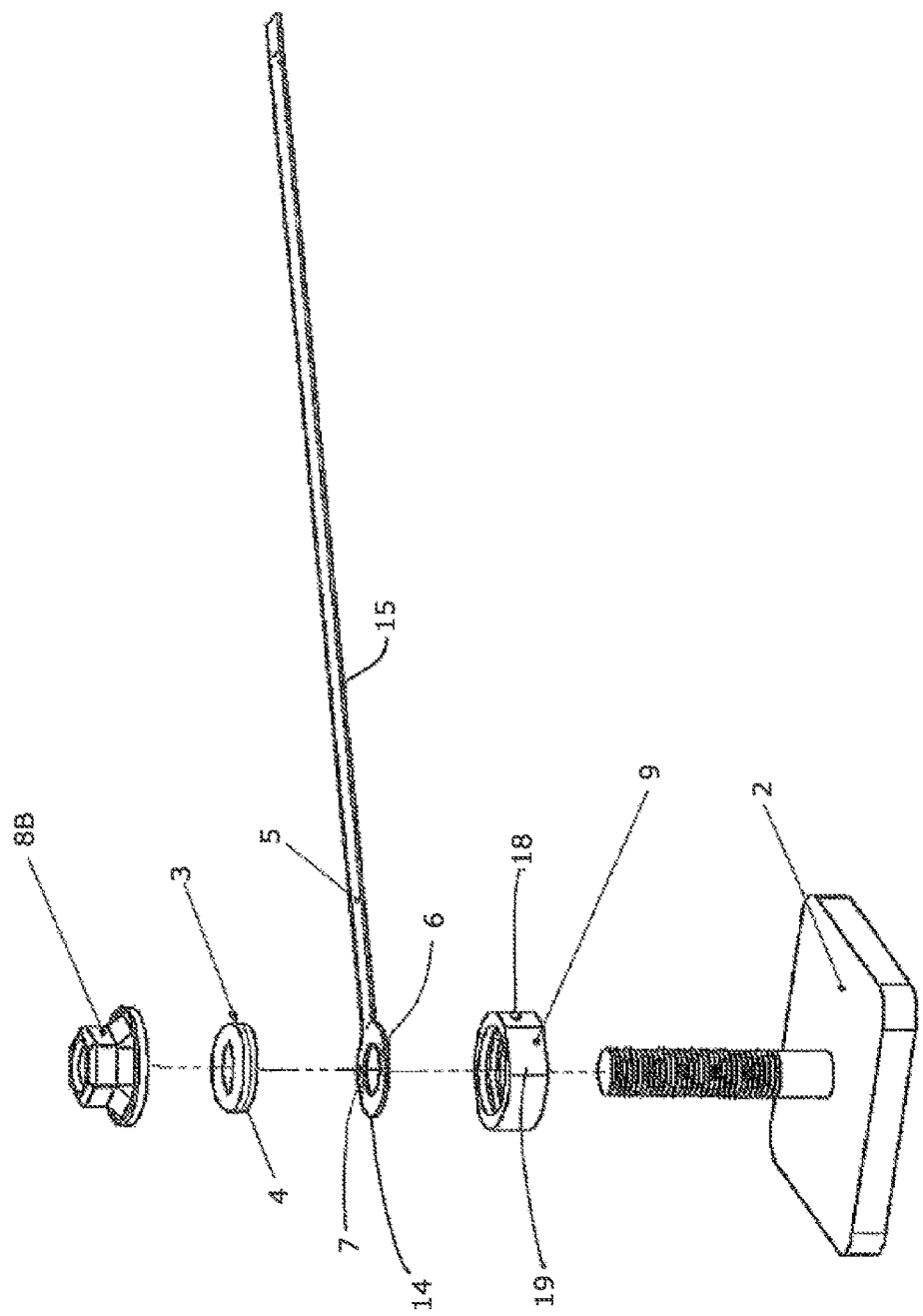

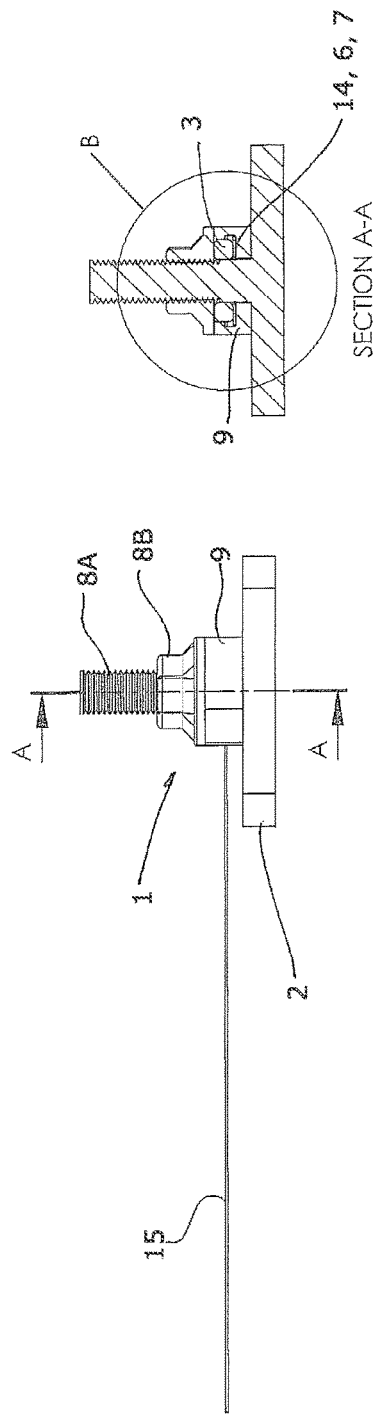
Figure 3A
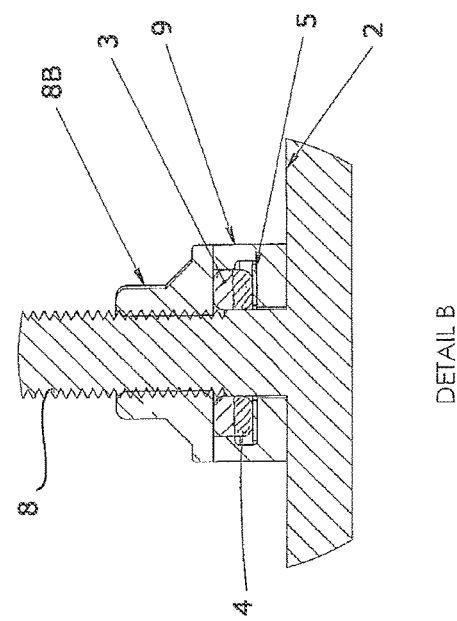
Figure 3B
Figure 4

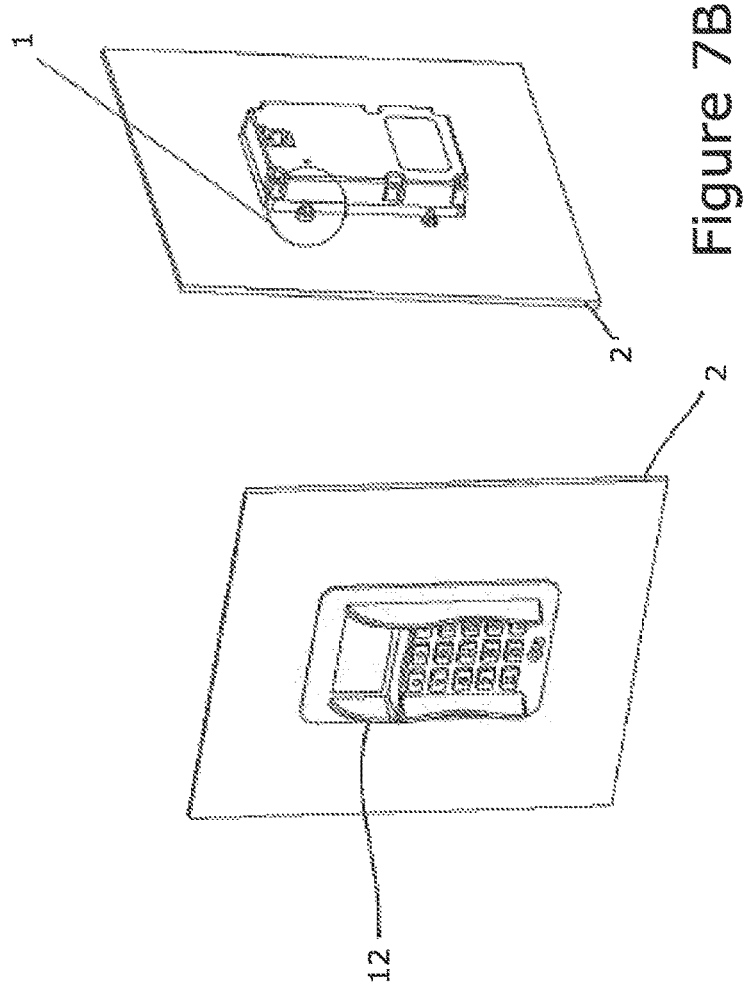
Figure 7A
Figure 7B
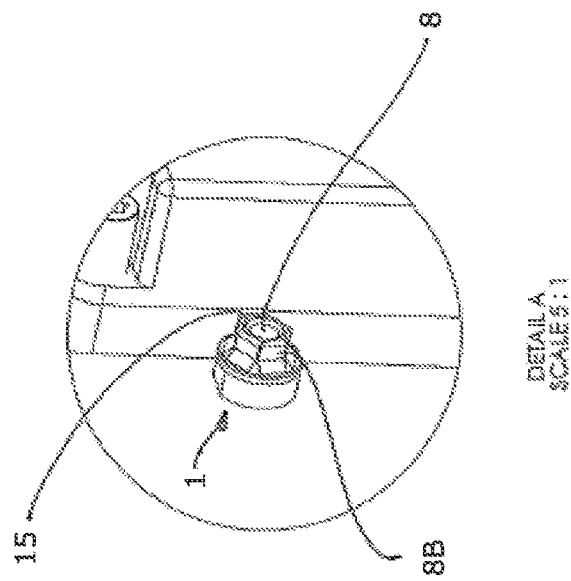
Figure 8

TAMPER EVIDENT SYSTEMS

TECHNICAL FIELD OF THE INVENTION

The present invention relates to tamper evident systems. In particular, though not solely, the present invention is directed to tamper evident devices, their methods of use and manufacture to detect unauthorised tampering of fasteners, or devices held in place by fasteners.

BACKGROUND OF THE INVENTION

There is increased use of systems that are remotely monitored. These systems may only occasionally be visited by human operators. Such systems may be remote in their location, or may be in everyday situations, for example in households, commercial premises, or urban or town environments.

The reasons these systems may rarely see human operators is because they may be numerous in number and therefore the cost of regular visits may be too high, or may be too remote to regularly visit. The systems themselves tend to be stable and will easily run for long periods of time with no need for a human operator on site.

Such systems however, because they may be in dense population areas may be the target of attempted theft, vandalism or other abuse which may compromise the system itself, or at least the cabinet, components, for example key pad or similar the system and equipment is contained in. The lack of regular human visits makes detection of such tampering difficult.

Examples of such systems are household and commercial power meters. These can now be easily monitored from the central control of the power company and thus there is no need to visit such equipment to take meter readings as there has been in the past. Moreover, there is a need to ensure such meters are not tampered with due to the cost of such meters and also the loss of revenue if such meters do not read correctly.

There may also be systems that are regularly visited, but their equipment or content may be mission critical (for example traffic light systems), of high value (for example currency vending machines), or that otherwise require confidence in their integrity and security (for example EFTPOS payment machines).

Tamper detection is also valuable for a computer or electronics suite. For example, it may allow an alert to occur if a person attempts to gain access to the internal units or remove device components. Equipment that has key pads, security card readers, or credit card and EFTPOS machine readers can often be tampered with to remove and replace the content with the tamperer's own equipment. This, for example, would direct funds to the tamperer's account instead of the correct account. Other tampering may involve insertion of information scanning systems to allow capture of a user's information, for example security keypad entry, credit card or EFTPOS card details.

There is also a need for a device which can detect the loosening of, for example, fasteners or other components relative to each other. Such loosening may occur due to tampering, but may also occur due to general wear and tear, vibration and movement, and the weather.

An example of a prior art solution is that found in U.S. Pat. No. 6,774,807 of Lehfeldt et al. This discloses a fastener that utilises a magnetic switch or micro-switch in the fastener or against the fastener periphery that activates when the fastener is turned through a certain angle. These switches are actuated by a mechanical system that must be in close proximity to the fastener, or utilise a magnetic pickup and associated components. As such they require extra systems and components and specially designed and shaped fasteners.

In this specification where reference has been made to patent specifications, other external documents, or other sources of information, this is generally for the purpose of providing a context for discussing the features of the invention. Unless specifically stated otherwise, reference to such external documents is not to be construed as an admission that such documents, or such sources of information, in any jurisdiction, are prior art, or form part of the common general knowledge in the art.

It is therefore an object of the present invention to provide an improved tamper evident system, or to overcome the above shortcomings or address the above desiderata, or to at least provide the public with a useful choice.

BRIEF DESCRIPTION OF THE INVENTION

In a first aspect the present invention consists in a tamper detection element adapted at least in part to locate against a first member to detect tampering therewith, comprising or including:
  a resilient deformable member able to deform because of said tampering ("tamper induced deformation"),
  a contact sensing member disposed towards said resilient deformable member; a first electrically conductive portion adjacent or on said resilient deformable member, and
  a second electrically conductive portion on said contact sensing member,
  wherein an electrical relationship can be formed between said first and second electrically conductive portions, and said tamper induced deformation results in a change of impedance of said electrical relationship, said change therefore indicative of said tampering.

Preferably said second electrically conductive portion is disposed towards said first electrically conductive portion.

Preferably there is a third electrically conductive portion on said contact sensing member and said impedance is measured between said second and third electrically conductive portions.

Preferably said element is located between said first member and a second member to detect tampering as a relative movement therebetween.

Preferably said deformation occurs due to said relative movement of said first member and said second member.

Preferably there is a housing to substantially contain said contact sensing member, said resilient deformable member extending at least in part beyond said housing.

Preferably tampering with said housing also results in said deformation.

Preferably said impedance changes due to change in either or both a contact area, or a pressure, between said first electrically conductive portion, and either or both of said second and said third electrically conductive portions.

Preferably said resilient deformable member is an endless member.

Preferably said element can locate about a body of a fastener extending from said first member, said body passing substantially through a middle of said element.

Preferably said element is adapted to be held in place against said first member by said second member which is engaged with said first member.

Preferably said resilient deformable member is at least in part comprised of any one or more of the following,
   an elastomer,
   a rubber, or
   other resilient deformable material.

Preferably said contact sensing member is substantially formed from a printed wire board.

Preferably an electrical connection may be made from said element to a voltage or current supply to measure said impedance and/or said variation thereof.

Preferably an impedance measurement device is externally connected to said element.

Preferably said impedance is made up of any one or more of a resistance, capacitance or inductance.

Preferably the said first electrically conductive portion and said second electrically conductive portion are substantially planar, at least where they are adapted to locate between said first member and said second member.

Preferably said resilient deformable member is arranged to lie substantially co-extensive with said contact sensing member.

Preferably an active region of said element to locate between said first member and said second member is substantially shaped to conform to and be co-extensive with a surface or surfaces of said first member and or said second member that it locates between.

In a second aspect the present invention consists in a method of detecting tampering with a first member, comprising or including the steps of:
   providing a resilient deformable member able to deform because of said tampering ("tamper induced deformation") with said first member;
   providing a contact sensing member disposed towards said resilient deformable member;
   providing a first electrically conductive portion adjacent or on said resilient deformable member, and
   providing a second electrically conductive portion on said contact sensing member
   connecting either or both said resilient deformable member and/or said contact sensing member to said first member,
   forming an electrical relationship between said first and second electrically conductive portions;
   wherein said tamper induced deformation results in a change of impedance of said electrical relationship;
   measuring said change; and
   deciding whether a tamper event has occurred or not.

Preferably said decision of whether a tamper event has occurred includes the step of determining whether said change meets or exceeds a threshold.

Preferably said method comprises the step of measuring a base reading of said impedance.

Preferably said method comprises periodically measuring said base reading of said impedance.

Preferably said method comprises triggering an alert if said tamper event is detected.

Preferably said alert is triggered proximal said connection to said first member or part thereof, or remote thereto.

Preferably there is a monitoring of a plurality of said tamper detecting elements connected throughout a piece of equipment, to detect tampering with said equipment.

Preferably there is a housing to substantially contain said contact sensing member, said resilient deformable member extending at least in part beyond said housing.

Preferably tampering with said housing results in said deformation.

Preferably said method includes the step of monitoring said impedance to detect a tamper event.

In a third aspect the present invention consists in equipment including one or more tamper detecting elements to detect a tampering with at least a first member of said equipment, said tamper detecting elements comprising;
   a resilient deformable member able to deform because of said tampering ("tamper induced deformation");
   a contact sensing member disposed towards said resilient deformable member;
   a first electrically conductive portion adjacent or on said resilient deformable member, and
   a second electrically conductive portion on said contact sensing member
   wherein an electrical relationship can be formed between said first and second electrically conductive portions, and said tamper induced deformation results in a change of impedance of said electrical relationship, said change therefore indicating said tampering.

Preferably there is a plurality of said elements to detect tampering with said equipment.

Preferably detection of whether a tamper event has occurred includes determining whether said change meets or exceeds a threshold.

Preferably a base reading of said impedance is made.

Preferably said base reading of said impedance is measured.

Preferably an alert is triggered if said tamper event is detected.

Preferably said alert is triggered proximal said connection to said first member, or remote thereto.

In a fourth aspect the present invention consists in a kit of parts for a tamper detecting element, comprising or including;
   A resilient deformable member able to deform because of said tampering ("tamper induced deformation");
   a contact sensing member disposed towards said resilient deformable member;
   a first electrically conductive portion adjacent or on said resilient deformable member, and
   a second electrically conductive portion on said contact sensing member,
   wherein an electrical relationship can be formed between said first and second electrically conductive portions, and said tamper induced deformation results in a change of impedance of said electrical relationship, said change therefore indicative of said tampering.

Preferably said kit includes a fastening means for said element.

Preferably said kit includes a housing to substantially contain said contact sensing member, said resilient deformable member extends at least in part beyond said housing.

Preferably said kit includes a plurality of said elements.

In a further aspect the present invention may be said to broadly consist in a tamper detection element adapted at least in part to locate against a first member to detect tampering therewith, comprising or including,
   A resilient deformable member having a first electrically conductive portion, said member able to deform because of said tampering ("tamper induced deformation"),
   A contact sensing member having a second and third electrically conductive portions disposed towards said first electrically conductive portion,
   Wherein an electrical relationship can be formed between said second and third electrically conductive portions, via said first electrically conductive portion, and said tamper induced deformation results in a change of impedance of said electrical relationship, said change therefore indicating said tampering.

In another aspect the present invention may be said to broadly consist in a method of providing a tamper detection element, comprising or including the steps of, Providing a resilient deformable member having a first electrically conductive portion, said member able to deform because of said tampering ("tamper induced deformation"), Providing a contact sensing member having a second electrically conductive portion disposed towards said first electrically conductive portion, Connecting either or both said resilient deformable member and/or said to contact sensing member a first member, directly or indirectly, forming an electrical circuit between said first and second electrically conductive portions, wherein said tamper induced deformation results in a change of resistance of said electrical circuit, and monitoring said resistance to detect a tamper event.

In yet another aspect the present invention may be said to broadly consist in equipment including one or more a tamper detecting elements, comprising or including, said tamper detecting elements including, A resilient deformable member having a first electrically conductive portion, said member able to deform because of said tampering ("tamper induced deformation"), A contact sensing member having a second and third electrically conductive portions disposed towards said first electrically conductive portion, Wherein an electrical relationship can be formed between said second and third electrically conductive portions, via said first electrically conductive portion, and said tamper induced deformation results in a change of impedance of said electrical relationship, said change therefore indicating said tampering.

In still yet another aspect the present invention may be said to broadly consist in a kit of parts for a tamper detecting element, comprising or including, A resilient deformable member having a first electrically conductive portion, said member able to deform because of said tampering ("tamper induced deformation"), A contact sensing member having a second and third electrically conductive portions disposed towards said first electrically conductive portion, Wherein an electrical relationship can be formed between said second and third electrically conductive portions, via said first electrically conductive portion, and said tamper induced deformation results in a change of impedance of said electrical relationship, said change therefore indicating said tampering.

In yet still another aspect the present invention may be said to broadly consist in a tamper detection element as herein described with reference to any one or more of the accompanying drawings.

In yet still another aspect the present invention may be said to broadly consist in a method of detecting tampering as herein described with reference to any one or more of the accompanying drawings.

In yet still another aspect the present invention may be said to broadly consist in a method of providing a tamper detection element as herein described with reference to any one or more of the accompanying drawings.

In yet still another aspect the present invention may be said to broadly consist in equipment including one or more a tamper detecting elements as herein described with reference to any one or more of the accompanying drawings.

In yet still another aspect the present invention may be said to broadly consist in a kit of parts for a tamper detecting element as herein described with reference to any one or more of the accompanying drawings.

As used herein the term "and/or" means "and" or "or", or both.

As used herein "(s)" following a noun means the plural and/or singular forms of the noun.

The term "comprising" as used in this specification means "consisting at least in part of". When interpreting statements in this specification which include that term, the features, prefaced by that term in each statement, all need to be present, but other features can also be present. Related terms such as "comprise" and "comprised" are to be interpreted in the same manner.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7).

The entire disclosures of all applications, patents and publications, cited above and below, if any, are hereby incorporated by reference.

To those skilled in the art to which the invention relates, many changes in construction and widely differing embodiments and application of the invention will suggest themselves without departing from the scope of the invention as defined in the appended claims. The disclosures and the descriptions herein are purely illustrative and are not intended to be in any sense limiting.

Other aspects of the invention may become apparent from the following description which is given by way of example only and with reference to the accompanying drawings.

BRIEF DESCRIPTION OF THE DRAWINGS

Preferred forms of the present invention will now be described with reference to the accompanying drawings in which;

FIG. 2 shows an exploded view of FIG. 1, FIG. 3 (A) shows a side view of FIG. 1, FIG. 3 (B) shows a cross section along line AA of FIG. 3A, FIG. 4 shows Detail B from FIG. 3(B), FIG. 5 close up showing pill deforming out of housing.

DETAILED DESCRIPTION OF THE INVENTION

Preferred embodiments will now be described with reference to FIGS. 1 through 9.

Figure 1:
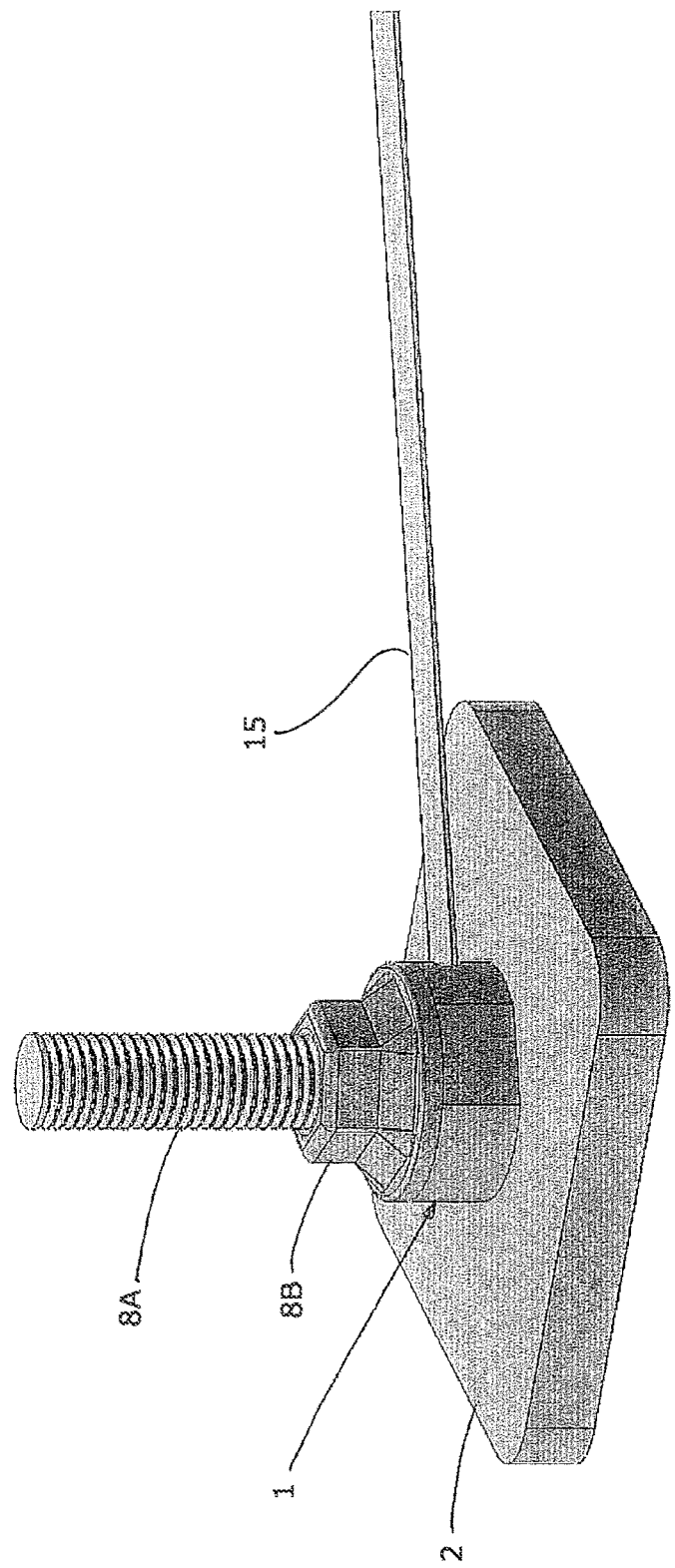
FIG. 1 shows an external isometric view of an embodiment of the tamper detecting element mounted to a threaded member on part of a piece of equipment.

The tamper detection element 1 is shown in FIGS. 1 and 2 held to a first member 2 by a second member 8. In this instance the second member 8 is comprised of a threaded fastener 8A and a nut 8B engaged thereon. There are several ways in which the element 1 can perform its task, and in the preferred embodiment it is sandwiched between a first member and a second member. A fastener is just one example of how it can be held in place, other methods can also be used, such as sandwiching between a first member and a second member which may be a planar surface such as a wall or door. For example the fastener 8A and nut 8b in FIGS. 3 and 4 may not be present, but rather the second member 8 is a surface of a cabinet or door sandwiching the element 1 in place.

The element 1 consists of a resilient deformable member 3 which when the element is secured in place is held down against or in proximity to a contact sensing member 5. In practice the resilient deformable member 3 is made from an elastomer such as silicon. However, any material that is compressible and resilient will suffice, for example rubber (natural or synthetic), or other such similar materials. In a preferred embodiment there is present a housing 9, to at least in part contain the members 3 and 5. The element 1 relies on change in pressure on the element to vary the impedance of the element.

The relationship between the resilient deformable member 3 and the contact sensing member 5 will determine if a tamper is occurring. The tamper detection may comprise an electrical circuit connected to tamper detection element 1. The electrical circuit may measure the impedance, or its variation, of the circuit, for example of the resilient deformable member 3 and the contact sensing members. The impedance measured may comprise one of, or a combination of, resistive, capacitive or inductive components.

In one embodiment as a resistive circuit the resilient deformable member 3 has a first electrically conductive portion 4 as seen in FIG. 4. This in the assembly shown is on the lower part of the resilient deformable member 3. In an alternative embodiment the first electrically conductive portion may be on the upper or a middle part of the resilient deformable member, for example in use as a capacitive circuit. In some embodiments the first electrically conductive portion may be encapsulated inside the resilient deformable member, for example in use as an inductive circuit. In a further alternative embodiment the first electrically conductive portion may be adjacent, and not part of the resilient deformable member. When the first conductive portion and the resilient deformable member are adjacent there may be an air gap (for example for capacitive sensing), spacer or other element's placed between them.

Figure 6:
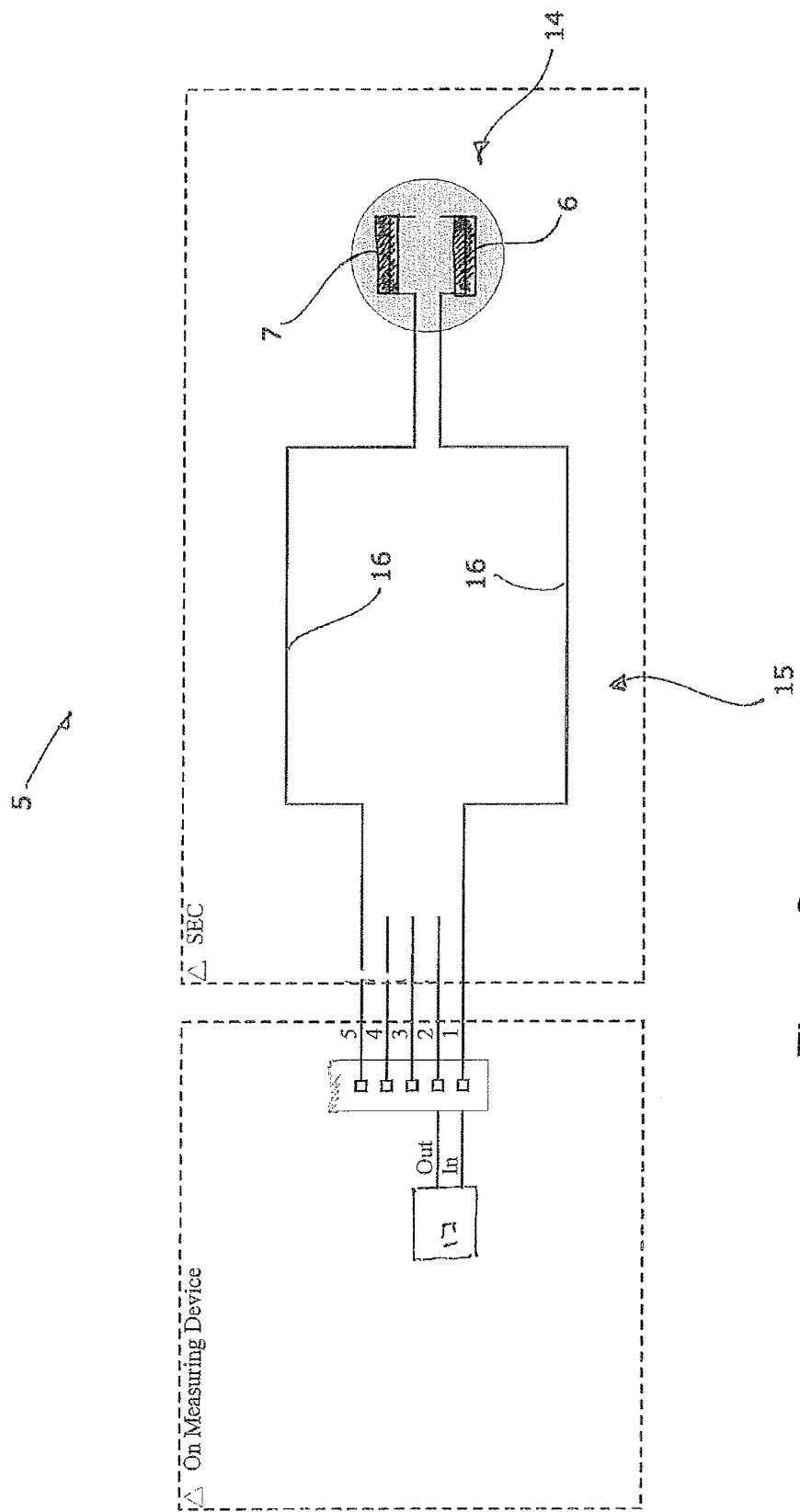
FIG. 6 is a circuit diagram for the tamper detecting element, FIG. 7 (A) is an isometric external view of equipment with tamper detecting element(s) located thereon, FIG. 7 (B) is an isometric internal view of FIG. 7(A), FIG. 8 Shows Detail C from FIG. 7(B), and FIG. 9 Shows various circuits in which the present invention uses impedance to sense tampering, with (9A) showing a single resistive circuit across once portion of the resilient deformable member (for example a (first) electrically conductive portion (for example on the deformable member) onto a single pad as a further (second) electrically conductive portion), (9B) showing a double resistive circuit with two or more sensed resistive portions (for example a (first) electrically conductive portion of the deformable member onto a first pad as the (second) electrically conductive portion and a second pad as the third electrically conductive portion, (9C) showing a single capacitive circuit across the resilient deformable member (for example a (first) electrically conductive portion of the deformable member spaced by off from a single pad (for example by a non-conductive portion of the deformable member to act as a dielectric) as a further (second) electrically conductive portion, (9D) a dual capacitive circuit of (9C), (9E) showing a single inductive circuit across one side of the deformable member where the member has a ferrite or similar core, and (9F) showing a dual inductive circuit of (9E).

The first electrically conductive portion 4 may be a lower portion of the member 3 that is conductive. The electrically conductive portion 4 may contact the contact sensing member 5, for example on a second electrically conductive portion 6 as shown in FIG. 6 or the portion and member may be separated by another element, such as an electrical insulator (for example when capacitive or inductive sensing is used). For example when the material is an elastomer it may be doped, for example with carbon to make that lower portion conductive to therefore form the first conductive portion 4. When it is the lower form and in contact with the second conductive portion 6 is may be used for resistive sensing of tampering. When it is on the upper portion (whether unitary or separate) then it may be part of a capacitive sensing or inductive sensing. In a further example the material may be silicon doped with ferrite to act as, for instance, a magnetic core. IN other forms, the deformable member 3 may act as a way to exert pressure (and therefore vary it n tampering) and other electrical components to form the impedance circuit may be located against it. However, there will be other methods known in the art for other materials that may also suffice. Preferably the upper portion and remainder of the member 3 that is not in contact with the contact sensing member 5 is not conductive. This may insulate the circuit from the effects of any wear of the housing 9. As shown in FIG. 2 the member 3 is an endless member, but can be formed as necessary to fit the desired application.

The contact sensing member 5 is shown in FIG. 2 (and FIG. 6) has at least one second electrically conductive portion 6 at the head 14. In the preferred form shown in FIG. 2 it has two such portions a second 6 and third 7 (or more) on a top surface, which are diametrically opposed, to allow for example electrical contact with the first conductive portion 4 when there is resistive sensing. Alternatively the portions may be below the surface (for example when physical electrical contact with deformable member 3 is not required, for example in capacitive or inductive sensing). The portions may cover substantially the whole of contact sensing member or may comprise a section or part of the contact sensing member. The head 14 of the contact sensing member 5 typically conforms to the shape of the resilient deformable member 3 it locates against but is not necessarily so. Therefore in the example shown in FIG. 2 the head 14 is also shown as an endless member. However, in other embodiments the head 14 of the contact sensing member 5 where it locates with the resilient deformable member 3 may be shaped as needed for the intended application.

The tail 15 extends from the head 14 of the contact sensing member 5 as shown in FIG. 2. The tail 15 contains circuit traces 16 which go to one each to the second electrically conductive portion 6 and third electrically conductive portion 7. Traces 16 then connect out and at the end of the tail 15 for connection to sensing equipment 17. The sensing equipment can be locally contained within the piece of equipment 12 which is being protected, and in addition may send signals locally for alerts or may send them remotely from the piece of equipment 12. For example the sensing equipment 17 may send a local alert for example a flashing light or otherwise, and may also or instead send a signal to a remote sensing station to sound an alarm to indicate tampering with the equipment.

The contact sensing member or members may comprise additional electrical contacts. The electrical contacts may be provided on a backing layer. The backing layer may provide support or encourage the contacts into appropriate positions. In a preferred embodiment these contacts will comprise a part of a printed wire board. The printed wire board may be rigid, flexible or comprise both rigid and flexible sections. In the following description it should be realised that reference to a printed wire board or other backing layer material encompasses a broad range of backing layers, flexible, rigid or otherwise. In one embodiment the contact sensing member 5 is a flexible printed circuit with exposed conductive portions forming the second electrically conductive portion 6 and third electrically conductive portion 7. Some, or all, of the areas of the flexible printed circuit may also be reinforced. This may help to insert it into equipment and/or for mounting purposes. In a further embodiment a rigid printed wiring board may be used, for instance to provide a more resilient member. In a preferred embodiment the total impedance of the circuit formed in conjunction with the first resilient deformable member 3 when in contact with the contact sensing member 5 is within a known range and any deviation may cause an alarm.

In one embodiment the impedance of an immediate physical contact between a resilient deformable member 3 having a first electrically conductive portion 4 against at least the second electrically conductive portion 6 and preferably third electrically conductive portion 7 is within a known range, and any deviation again, may cause an alarm. In an alternative embodiment the impedance of an electrical relationship between a first electrically conductive portion 4 adjacent or on said resilient deformable member 3 and a second electrically conductive portion 6 and possibly a third electrically conductive portion 7 is within a known range, and any deviation again, may cause an alarm. In this alternative embodiment there may not be contact between all or any of the conductive portions 4, 6, and 7 and the capacitance or inductance between the conductive portions may be measured.

Figure 9:
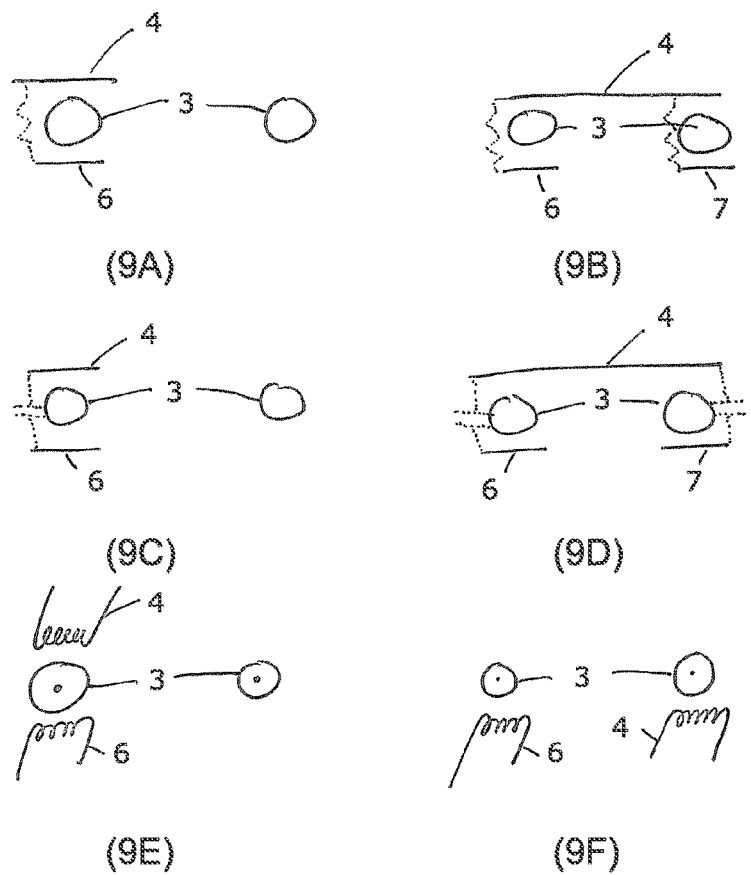

In an alternative embodiment the total impedance of the circuit formed in conjunction with the first resilient deformable member 3 when in contact with the contact sensing member 5 is within a known range and any deviation may cause an alarm. The change in the total impedance of the circuit formed may be due to a change electrical relationship between the members 3, 5. In a first example the capacitance between the resilient deformable member 3 and its first electrically conductive portion 4 and at least the second electrically conductive portion 6 and preferably third electrically conductive portion 7 is within a known range, and any deviation again, may cause an alarm. For instance the capacitance of two conductive areas will change if the distance or pressure between those areas or their spatial relationship is altered. A straightforward example of this is a parallel plate capacitor. In a further example the inductance between the resilient deformable member 3 and its first electrically conductive portion 4 and at least the second electrically conductive portion 6 and preferably the third electrically conductive portion 7 is within a known range, and any deviation due to a change in pressure or relative movement, may cause an alarm. For instance, the resilient deformable member 3 may comprise a coil and the movement of the first electrically conductive portion 4 may change the inductance apparent to the first electrically conductive member and a second portion 6. In a further example the resistance of a path through the electrically conductive portion 7 of the resilient deformable member 3 and at least the second electrically conductive portion 6 and preferably the third conductive portion 7 is within a known range, and any deviation due to a change in pressure or relative movement may cause an alarm. In a simple example contact could be made between the conductive portions forming a small circuit between the second and third conductive portions, alternatively this may be a capacitive or inductive circuit as shown in FIG. 9. The total measured impedance may include a combination of resistance, capacitance or inductance, in combination or as separate measurements.

FIG. 9 demonstrates further methods of creating measurable impedance. It will be clear to the reader that these are only example methods and may be combined or alternative methods may be used. Looking first at FIG. 9a, a measurement may be of the resistance between a first electrically conductive portion 4 (which in the preferred embodiment is part of the deformable member 3), adjacent to the resilient deformable member 3, in physical contact with a second electrically conductive portion 6 below the member. In an alternative resistive embodiment (FIG. 9b) a third electrically conductive portion 7 may be present on the contact sensing member, or elsewhere. This portion may allow a circuit to be formed between the first, second and third contact members for sensing. In some embodiments the first conductive portion may be on (part of) the resilient deformable member 3.

FIGS. 9c and 9d demonstrate alternative embodiments which may measure capacitive impedance. FIG. 9c shows a first electrically conductive member 4 and a second electrically conductive member 6 separated by a (or part of a) resilient deformable member 3. In this embodiment the member 3 acts as a dielectric between the two conductive portions and movement of the resilient deformable member will result in a change in the level of capacitance of the electrical relationship between the portions. In FIG. 9d a further embodiment is shown where a third electrically conductive portion 7 is present, located on the contact sensing member 6. In this embodiment the first electrically conductive portion 4 may be adjacent to the resilient deformable member 3—placed directly above or separated by an air-gap or intermediate layer—or the first electrically conductive portion 4 may be on (part of or encapsulated by) the resilient deformable member 3.

FIGS. 9e and 9f demonstrate further alternative embodiments which may measure inductive impedance. FIG. 9e shows a system in which first 4 and second 6 electrically conductive members may be coils or loops. The resilient deformable member 3 may comprise a silicon doped ferrite core to increase the effect of any tamper induced deformation, or may be separate thereto, and simply hold the core proximate the coils. Tamper induced deformation may be measured by the change in inductance between the conductive portions. In alternative embodiments the conductive members may be wound around areas of the tamper detection element as would be known by one skilled in the art. FIG. 9f shows a further embodiment where both the first 4 and second 6 electrically conductive portions are located on the contact sensing member. The resilient deformable member 3 may be doped with ferrite (or support a separate core) so as to provide a magnetically permeable core to improve coupling between the conductive portions. Other circuit traces may also be present in the printed wire board for redundancy or other purposes.

The tamper detection element 1 also has a housing 9. The housing may be designed to contain the contact sensing member and the resilient deformable member and ensure appropriate contact and positioning between them. It can also serve to protect the members 3 and 5 to prevent tampering with them. In a preferred embodiment shown in FIG. 4 the housing is hollowed out in the direction towards the resilient deformable member 3 and contact sensing member 5 to at least receive the head 14 of the contact sensing member 5 and a substantial part of the resilient deformable member 3. In a preferred form of the housing 9 there is a small aperture 18 in a side wall to allow the tail 15 to be passed there through and may also be an internal relief to help retain at least the head 14 of the contact sensing member 5. The housing 9 may also have one or more engaging features 19 to provide engagement and holding with a tool (not shown). For example in FIG. 2 the engaging features 19 are flat as shown on a side wall and opposing side wall of the housing 9 for holding by pliers or a spanner or similar tool. In a second preferred embodiment board the housing may be substantially larger than the contact sensing member 5. The additional space in the housing may contain a printed wire board. The printed wire board may comprise further security features and/or may comprise an interface between the contact sensing member 5 and the tail 15. The printed wire board may be shaped to fit in a hollow region of the housing. The shape of the housing may provide means to easily remove or attach the device. In this embodiment the tail 15 may be detachable from the housing, in some cases allowing easier installation. As in the previous embodiment the housing may be hollowed out in the direction towards the resilient deformable member 3, allowing contact or close proximity between resilient deformable member 3 and the contact sensing member 5.

The housing 9 is preferable made from a resilient material. This material may be similar to that used for the second member 8, in the embodiment shown this may be stainless steel or a similar metal. In a preferred embodiment the material may be a resilient plastic, for example the plastic may be PVC. As shown in FIG. 2 the housing 9 is an endless member and is contoured to conform with those parts of the conduct sensing member 5 and resilient to formable member 3 which reside therein. However, in other embodiments the housing 9 could be shaped as desired for the applicable installation. In a particular embodiment the housing may appear substantially rectangular. The rectangle may have rounded corners to contour to a second member 8 it is attached to. The end of the rectangle distal from the second member 8 may have substantially sharp corners and may comprise the tail 15, or the attachment means for the tail 15.

An embodiment of the assembly of the tamper detection element 1 is shown in FIGS. 3a, 3b and 4. In the assembly shown there is a first member 2 to which the tamper detection element 1 is attached. In the assembly shown the second member is a threaded fastener 8a together with a nut 8b thereon. In assembling the contact sensing member 5 is assembled with the housing 9 (though typically this will be preassembled and come as a sub assembly) together with the resilient deformable member 3. Again the resiliently deformable member may already be held captive in the housing or maybe assembled with it as required. The tamper detection element 1 is then located in the example shown over the threaded fastener 8a and if necessary if not assembled beforehand the resiliently deformable member 3 is then located there over and into the appropriate cavity in the housing 9. The securing nut 8b is done up over the thread fastener 8a to lock the assembled tamper detection element 1 in place. As can be seen in FIG. 4 the resiliently deformable member 3 is squashed between the second member 8 (in this case the threaded fastener 8a and nut 8b) and the contact sensing member 5.

Shown in FIG. 4 also is the first electrically conductive portion 4 of the resilient deformable member 3. As can be seen the first electrically conductive portion 4 is held against the second electrically conductive portion 6 and in the preferred embodiment the third electrically conductive portion 7. When a voltage or current is applied to the second electrically conductive portion 6 a circuit is formed across to the third electrically conductive portion 7 via the first electrically conductive portion 4. In some cases an AC current or voltage may be used. The degree of pressure of the first electrically conductive portion 4 will vary the impedance between the second and third electrically conductive portions 6 and 7 respectively. This effect, caused by the tamper induced deformation of the resilient deformable member 3 may be enhanced by appropriate selection of the resilient deformable member 3 material. Therefore once the tamper detection element 1 is assembled a base reading can be taken and thereafter variance in this base reading, for example the total impedance of the circuit, outside of certain thresholds will indicate that tampering is occurring, for example the distance between the first member 2 and second member 8 is changing. For example an unauthorised user may be undoing the nut at 8b which will then reduce the pressure of the resilient deformable member 3 against the contact sensing member 5 thus resulting in an increased impedance of this circuit. Once this exceeds the threshold value then an alarm or tampering event will be triggered. In other embodiments less preferable the circuit may be formed and measured between the first electrically conductive portion 4 and the second electrically conductive portion 6 only. In an alternative embodiment there may not be direct contact between the first electrically conductive portion 4 and the second electrically conductive portion 6. In this case a capacitance may be measured and the pressure between the resilient deformable member and the contact sensing member 5 will alter the relationship between the members and the impedance will change.

Figure 5:
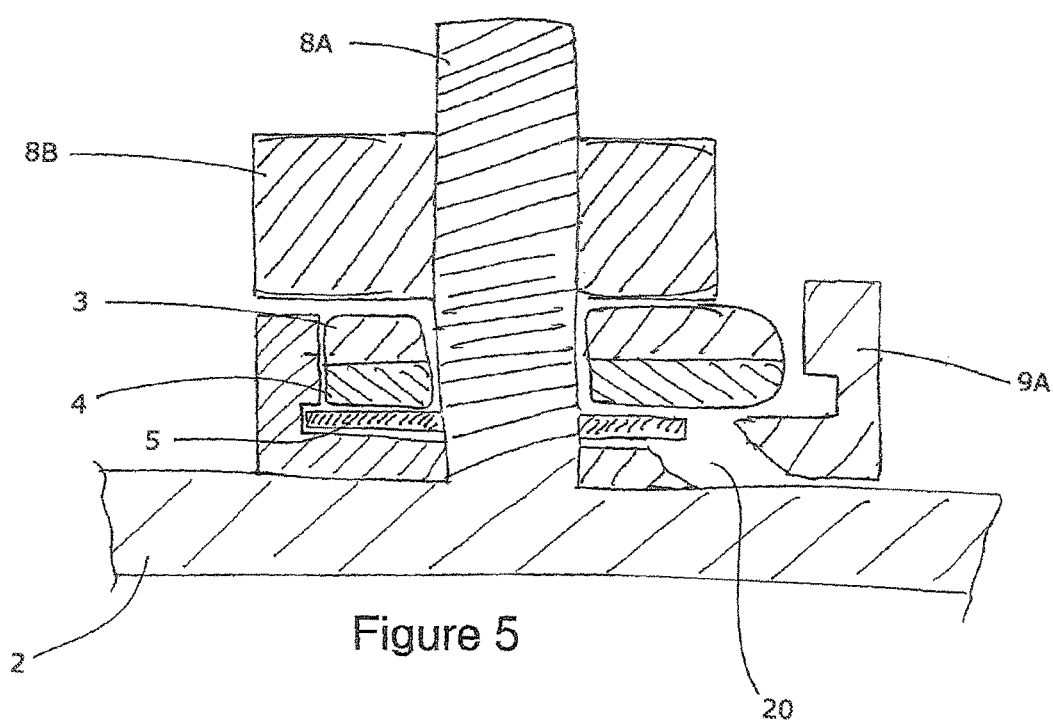

Further should the housing 9 be tampered with, for example drilling in from the side or similar attempt at removal or tampering with the circuit the resilient deformable member 3 will "ooze" out the hole that is formed and reduce the pressure of the portion 4 against, or proximate the portion or portions 6 and 7 and therefore again vary the impedance of the circuit. The resilient deformable member is adapted to allow this tamper induced deformation. In some embodiments the material used for the resilient deformable member may be selected to enhance characteristics of the tamper induced deformation. This is shown in FIG. 5, where part of the housing 9A has been broken away. This again will once a threshold is exceeded result in an alarm or tamper alert.

In the embodiment shown the first member 2 is a mounting plate and this for example could be the plate of a piece of equipment through which the second member 8b as a threaded member is passed there through to hold for example a further piece of equipment against the first member 2 and when an attempt is made to remove or alter any of the pieces of equipment by tampering with the tamper detection element 1 an alarm will result. For example any attempt to create relative movement between the first member 2 and second member 8 (or elements 8a or 8b) will result in a reduced or varied impedance of the circuit and again once the threshold is exceeded an alarm will sound.

The tamper detection element may be, connected to a separate measurement device, preferably through a connecting wire or cable. The tail 15 is preferably a flat cable and may contain further traces or security devices. In a preferred embodiment this is a flat USB cable. FIG. 6 shows an embodiment of this connection using a 5 wire cable. In this embodiment separate electrical connection is made to each of the electrically conductive portions 6 and 7. In an alternative embodiment a single electrical connection may be used, particularly if measuring the impedance or capacitance. In an alternative embodiment further electrical connections may be used or further tracks may be present on the tail or measuring device for signal noise reduction or security means.

Such an assembly is shown in FIGS. 7a, b and FIG. 8 where a piece of equipment 12 in this case a security key pad is held to a plate or first member 2 via a threaded fastener as the second member 8. Any attempt for example to undo the security nut 8b will result in a varied impedance of the circuit and sound an alarm. In FIG. 8 the tail 15 on the contact sensing member 5 can be seen and in this case it is loomed into the internal parts of the piece of equipment 12. In other embodiments the tamper detection element 1 may locate between a first member 2 and second member 8 for example as two plates or portions of a cabinet and when relative movement between the two portions occurs pressure is increased or decreased on the tamper detection element and therefore the resulting impedance in the circuit will vary. In this application the tamper detection element 1 may be in cased or packaged to retain all parts therein and may have some form of adhesive mounting or similar to mount it to one of the two members 2 or 8 and again a base reading taken when the two members are at the correct relationship with each other.

The equipment 12 to be protected may be assembled with the tamper detection elements 1 as part of its assembly process or the tamper detection elements 1 may be retrofitted to the equipment 12 either on site or as part of the maintenance of the equipment 12.

In the preferred use of the present invention there is a plurality of detection element and these may be arrayed throughout the equipment 12 being protected. The invention may also consist of the kit of parts to provide one or more tamper detections elements for example to supply of equipment 12 assemblers or maintainers for pre or post fitting thereto.

The foregoing description of the invention includes preferred forms thereof. Modifications may be made thereto without departing from the scope of the invention.

What we claim is:

1. A tamper detection element adapted at least in part to be held against a first member by a fastener to detect unauthorised tampering therewith, the tamper detection element comprising:
    a resilient deformable member able to deform because of said tampering,
    a rigid housing to locate and substantially contain said resilient deformable member to said first member,
    wherein the resilient deformable member is an elastomeric member and the resilient deformable member and the rigid housing locate about a body of the fastener, and wherein said housing conforms with and captures the resilient deformable member within the rigid housing about the body of the fastener,
    a contact sensing member disposed towards said resilient deformable member and substantially contained in said rigid housing,
    a first electrically conductive portion adjacent or on said resilient deformable member, and
    a second electrically conductive portion on said contact sensing member, wherein an electrical relationship can be formed between said first and second electrically conductive portions, and a tamper induced deformation of said resilient deformable member varies the impedance of said electrical relationship, said variation indicative of said tampering to detect loosening of the fastener and/or tampering with the housing.

2. The element as claimed in claim 1 wherein in use the resilient deformable member is held in compression.

3. The element as claimed claim 1 wherein the resilient deformable member can be removed from and reinserted into the tamper detection element.

4. The element as claimed in claim 1 wherein said second electrically conductive portion is disposed towards said first electrically conductive portion.

5. The element as claimed in claim 1 wherein a third electrically conductive portion is on said contact sensing member and said impedance is measured between said second and third electrically conductive portions.

6. The element as claimed in claim 5 wherein said impedance changes due to change in either or both a contact area, or a pressure, between said first electrically conductive portion, and either or both of said second and said third electrically conductive portions.

7. The element as claimed in claim 1 wherein said element is located between said first member and a second member to detect tampering as a relative movement therebetween.

8. The element as claimed in claim 7 which is adapted to be held in place against said first member by said second member which is engaged with said first member.

9. The element as claimed in claim 7 wherein said deformation occurs due to said relative movement of said first member and said second member.

10. The element as claimed in claim 1 wherein tampering with said rigid housing also results in said deformation.

11. The element as claimed in claim 1 wherein said impedance is made up of any one or more of a resistance, capacitance or inductance.

12. The element as claimed in claim 7 wherein an active region of said element to locate between said first member and said second member is substantially shaped to conform to and be co-extensive with a surface or surfaces of said first member and or said second member that it locates between.

13. The element as claimed in claim 1, wherein the resilient deformable member comprises the first electrically conductive portion, either on or encapsulated in the resilient deformable member.

14. A method of detecting tampering with a first member or fastener associated with the first member, comprising the steps of:
    providing a resilient deformable member able to deform because of said tampering, wherein the resilient deformable member is an elastomeric member;
    providing a rigid housing to locate and substantially contain said resilient deformable member to said first member;
    providing a contact sensing member substantially contained in said rigid housing and disposed towards said resilient deformable member;
    providing a first electrically conductive portion adjacent or on said resilient deformable member; and
    providing a second electrically conductive portion on said contact sensing member;
    locating the resilient deformable member and the housing about a body of the fastener, and wherein said housing conforms with and captures the resilient deformable member within the rigid housing about the body of the fastener;
    forming an electrical relationship between said first and second electrically conductive portions;

wherein a tamper induced deformation results in a variation in an impedance of said electrical relationship, the variation indicative of tampering to detect loosening of the fastener and/or tampering with the housing;
measuring said variation; and
deciding whether a tamper event has occurred or not.

15. The method as claimed in claim 14 wherein the resilient deformable member is, in use, held in compression by said first member.

16. The method as claimed in claim 14 wherein said decision of whether a tamper event has occurred includes the step of determining whether said change meets or exceeds a threshold.

17. The method as claimed in claim 14 wherein said method comprises the step of measuring a base reading of said impedance.

18. The method as claimed in claim 17 wherein said method comprises periodically measuring said base reading of said impedance.

19. The method as claimed in claim 14 wherein said method comprises triggering an alert if said tamper event is detected.

20. The method as claimed in claim 14 comprising monitoring a plurality of said tamper detecting elements connected throughout a piece of equipment, to detect tampering with said equipment.

21. The method as claimed in claim 14 wherein tampering with said rigid housing results in said deformation.

22. The kit of parts for at least one tamper detecting element, comprising;
a resilient deformable member able to deform because of tampering,
a rigid housing to locate and substantially contain said resilient deformable member to said first member,
wherein the resilient deformable member is an elastomeric member and the resilient deformable member and the rigid housing locate about a body of a fastener, and wherein said housing conforms with and captures the resilient deformable member within the rigid housing about the body of the fastener,
a contact sensing member disposed towards said resilient deformable member;
said rigid housing to substantially contain said contact sensing member,
a first electrically conductive portion adjacent or on said resilient deformable member, and
a second electrically conductive portion on said contact sensing member,
wherein an electrical relationship can be formed between said first and second electrically conductive portions, and a tamper induced deformation of said resilient deformable member varies the impedance of said electrical relationship, said variation indicative of said tampering to detect loosening of the fastener and/or tampering with the housing.

23. The kit of parts as claimed in claim 22 wherein said kit includes a fastening means for said element.

* * * * *